United States Patent
Chen

(10) Patent No.: US 8,205,665 B2
(45) Date of Patent: Jun. 26, 2012

(54) HEAT DISSIPATION DEVICE

(75) Inventor: Rung-An Chen, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 619 days.

(21) Appl. No.: 12/396,482

(22) Filed: Mar. 3, 2009

(65) Prior Publication Data

US 2010/0018669 A1 Jan. 28, 2010

(30) Foreign Application Priority Data

Jul. 28, 2008 (CN) .......................... 2008 1 0303126

(51) Int. Cl.
*H05K 7/20* (2006.01)

(52) U.S. Cl. ...................................... 165/80.3; 361/710

(58) Field of Classification Search ................. 165/80.3, 165/104.33, 185
See application file for complete search history.

(56) References Cited

U.S. PATENT DOCUMENTS

| 4,009,752 | A  | * | 3/1977  | Wilson ............................ 165/81 |
| 6,336,498 | B1 | * | 1/2002  | Wei ............................... 165/80.3 |
| 6,842,342 | B1 | * | 1/2005  | Lin ................................. 361/710 |
| 7,140,423 | B2 | * | 11/2006 | Chang ........................ 165/104.33 |
| 7,370,692 | B2 | * | 5/2008  | Wei ............................... 165/80.3 |
| 2003/0111213 | A1 | * | 6/2003  | Chang et al. ............. 165/104.33 |
| 2004/0200609 | A1 | * | 10/2004 | Chen ............................. 165/185 |
| 2005/0259398 | A1 | * | 11/2005 | Liu et al. ....................... 361/703 |
| 2008/0121368 | A1 | * | 5/2008  | Chen et al. .................. 165/80.3 |
| 2008/0142192 | A1 | * | 6/2008  | Yu et al. ........................ 165/80.3 |
| 2008/0302506 | A1 | * | 12/2008 | Luo et al. ..................... 165/80.3 |

FOREIGN PATENT DOCUMENTS

| TW | 200537278 A | 11/2005 |
| TW | 200539784 A | 12/2005 |

* cited by examiner

*Primary Examiner* — Allen Flanigan
(74) *Attorney, Agent, or Firm* — Altis Law Group, Inc.

(57) ABSTRACT

A heat dissipation device includes a heat sink having a first fin unit and a second fin unit adjoining each other. The first fin unit includes a plurality of parallel stacked first fins each including a main body and two flanges extending perpendicularly from two opposite sides of the main body. The second fin unit includes a plurality of parallel stacked second fins each including a main body and two flanges extending perpendicularly from two opposite sides of the main body. The first fin unit and the second fin unit are arranged back-to-back. The main body of an outmost first fin adjacent to the second fin unit abuts the main body of an outmost second fin adjacent to the first fin unit. An interval between two neighboring first fins is smaller than that between two neighboring second fins.

12 Claims, 4 Drawing Sheets

HEAT DISSIPATION DEVICE

BACKGROUND

1. Technical Field

The disclosure relates to heat dissipation, and particularly to a heat dissipation device having at least two fin units for dissipating heat generated by an electronic component.

2. Description of Related Art

Electronic components operating at high speeds generate excessive heat which must be displaced efficiently to ensure normal operation. Typically, a heat dissipation device attached to the electronic component provides such heat dissipation.

A conventional heat dissipation device includes a base and a heat sink including a plurality of fins arranged thereon. Each of the fins includes a main body and two flanges extending from top and bottom sides of the main body, respectively. During assembly of the heat dissipation device, a solder layer is coated on a top surface of the base. The fins are arranged on the base from one side towards an opposite side, for example from a front towards a rear side, with the flanges of a rear fin of each two neighboring fins contacting the main body of a front fin. The flanges on the bottom sides of the heat sink contact the top surface of the base, and are affixed thereto by soldering.

Since the fins are arranged on the base along the same orientation, a frontmost fin is taken as a reference position for mounting of the other fins of the heat sink, such that considerable deviation is generated at a rearmost fin of the heat sink with repeated superposition of the position deviation between each two neighboring fins. When the position deviation of the rearmost fins respective to the reference position exceeds a normal or desired limit, the corresponding increase in size of the heat sink negatively affects assembly of the heat dissipation device.

It is thus desirable to provide a heat dissipation device which can address the described limitations.

DETAILED DESCRIPTION OF THE EMBODIMENTS

Figure 1:
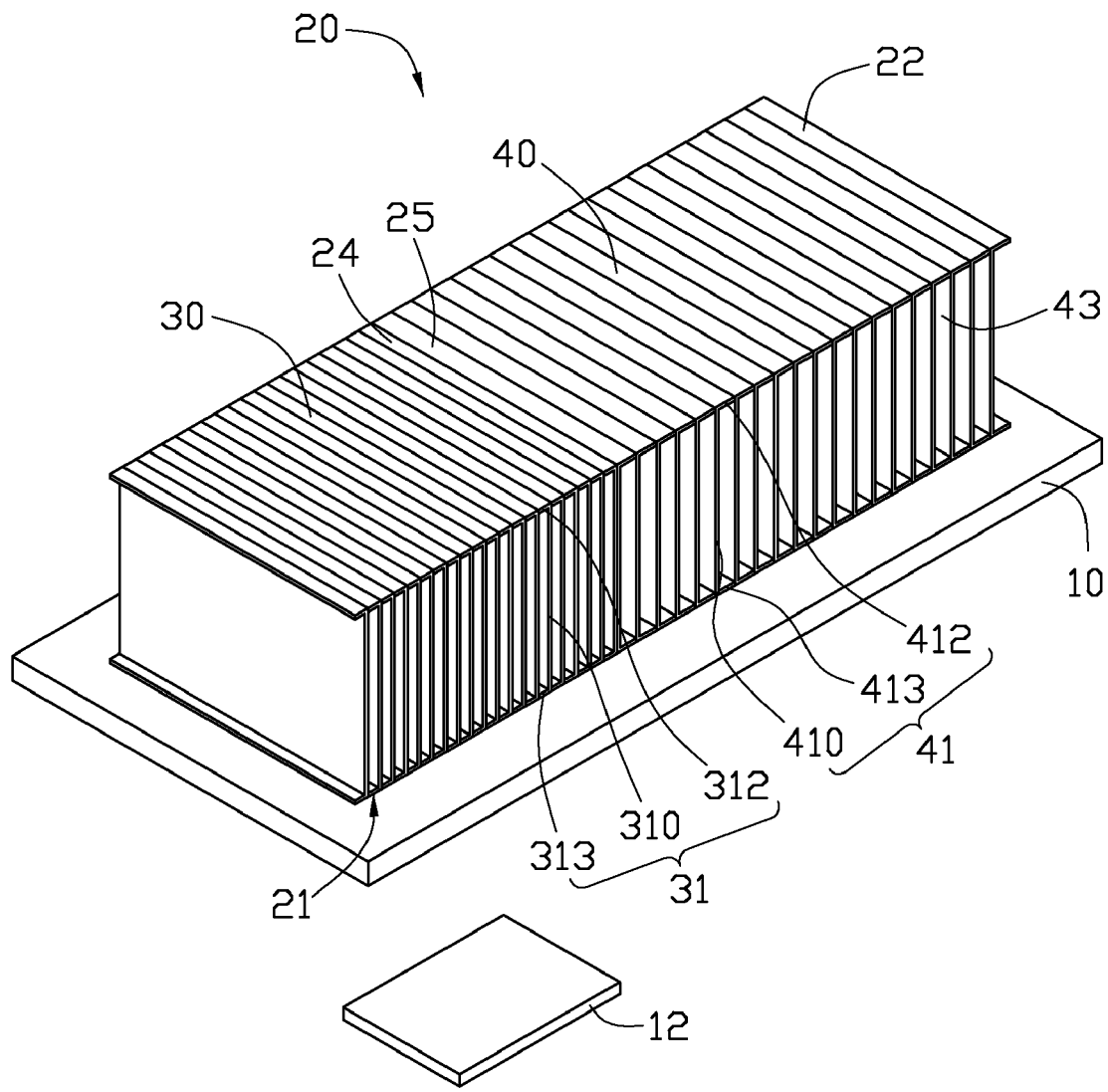
FIG. 1 is an isometric, assembled view of a heat dissipation device according to a first embodiment, together with an electronic component.

Reference will now be made to the drawing figures to describe the embodiments in detail.

Referring to FIG. 1, a heat dissipation device for an electronic component 12 includes a base 10 arranged on the electronic component 12 and a heat sink 20 on the base 10.

Figure 3:
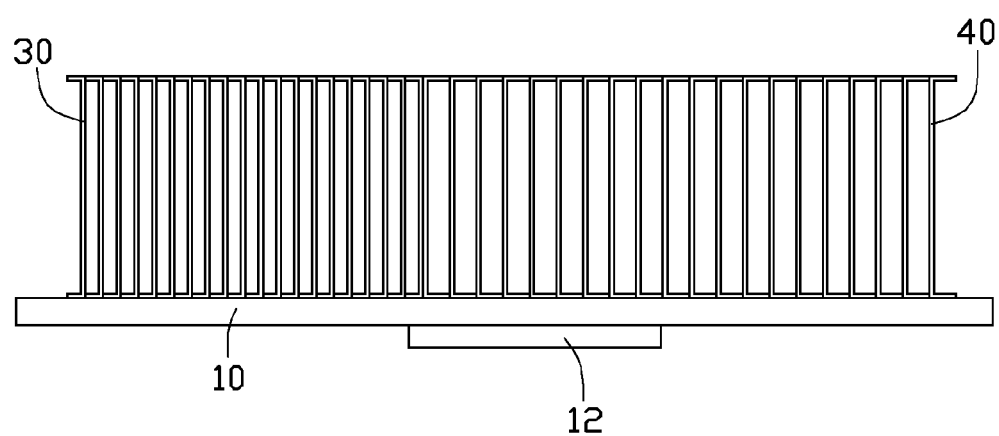
FIG. 3 is a front plan view of the heat dissipation device and electronic component of FIG. 1 attached together.

Also referring to FIG. 3, the base 10 is rectangular, and has a planar bottom surface thermally attached to the electronic component 12 and a planar top surface supporting the heat sink 20 thereon. The base 10 is highly thermal conductive material, such as copper.

The heat sink 20 includes a first fin unit 30 and a second fin unit 40 arranged side by side. The first fin unit 30 includes a plurality of parallel first fins 31 arranged on one portion, such as a front portion, of the base 10. The second fin unit 40 includes a plurality of parallel second fins 41 arranged on an opposite portion, such as a rear portion, of the base 10.

Each of the first fins 31 includes a rectangular main body 310, a top flange 312, and a bottom flange 313 extending perpendicularly from top and bottom sides of the main body 310 towards a front side of the main body 310, respectively. Distal ends of the flanges 312, 313 of each rear first fin 31 abut the main body 310 of the front first fin 31. The flanges 312, 313 of each first fin 31 have a first width the same as that of the other first fins 31. The top flanges 312 cooperatively form a top plate of the first fin unit 30 at the top side thereof, and the bottom flanges 313 cooperatively form a bottom plate of the first fin unit 30 at the bottom side thereof.

Each of the second fins 41 includes a rectangular main body 410, a top flange 412, and a bottom flange 413 extending perpendicularly from top and bottom sides of the main body 410 towards a rear side of the main body 410, respectively. The main body 410 of a rear second fin 41 of each two neighboring second fins 41 abuts the distal ends of the flanges 412, 413 of the front second fin 41, forming two plates on the top and bottom sides of the second fin unit 40, respectively. The flanges 412, 413 of each of the second fins 41 have a second width exceeding the first width of the flanges 312, 313 of the first fin unit 30. The main bodies 310, 410 of the first and second fins 31, 41 are the same height, rendering the bottom plates of the first and second fin units 30, 40 coplanar to form a planar bottom plate 21 of the heat sink 20, and the top plates of the first and second fin units 30, 40 coplanar to form a planar top plate 22 of the heat sink 20.

During assembly of the heat dissipation device, the first fin unit 30 and the second fin unit 40 are mounted on the base 10 back-to-back. The main body 310 of a rearmost first fin 31, located at a rear side of the first fin unit 30, abuts the main body 410 of a frontmost second fin 41, located at a front side of the second fin unit 40, on a middle portion of the base 10. The rearmost first fin 31 is taken as a reference position 24 for mounting of the other first fins 31 of the heat sink 20. Positioning of the front of each two neighboring first fins 31 is based on the distal ends of the flanges 312, 313 of the rear first fin 31. That is, the other first fins 31 of the first fin unit 30 are arranged from the rearmost first fin 31 (the middle portion of the base 10) towards a front side of the base 10 one by one, with the flanges 312, 313 towards the front side of the base 10. In addition, the frontmost second fin 41 is taken as another reference position 25 for assembly of the other second fins 41 of the heat sink 20. A position of the rear second fin 41 of each two neighboring second fins 41 is based on the distal ends of the flanges 412, 413 of the front second fin 41. That is, the other second fins 41 of the second fin unit 40 are arranged from the frontmost second fin 41 (the middle portion of the base 10) towards a rear side of the base 10 one by one, with the flanges 412, 413 towards the rear side of the base 10.

Before the first and the second fin units 30, 40 are mounted to the base 10, a layer of solder is pre-coated on the top surface thereof. After the first fins 31 of the first unit 30 and the second fins 41 of the second fin unit 40 are arranged from the middle portion of the base 10 towards the front side and the rear side of the base 10, respectively, the bottom plate 21 of the heat sink 20 contacts the top surface of the base 10, and is affixed thereto by soldering.

Since the heat sink 20 includes the first fins 31 and the second fins 41, arranged from the middle portion of the base 10 towards opposite sides of the base 10 respectively, a distance between the reference position 24 of the first fin unit 30, i.e., the rearmost first fin 31, and the frontmost first fin 31 which acts as the frontmost fin of the heat sink 20, is considerably decreased, as is a distance between the reference position 25 of the second fin unit 40, that is, the frontmost second fin 41, and the rearmost second fin 41 which acts as the rearmost fin of the heat sink 20. Thus, position deviation of the frontmost fin of the heat sink 20 with respect to the reference position 24 is only affected by the position deviations of the first fins 31, but not by the second fins 41 of the heat sink 20 compared with conventional heat sinks. Similarly, position deviation of the rearmost fin of the heat sink 20 with respect to the reference position 25 is reduced due to the position deviation of the rearmost fin only being affected by the position deviations generated by the second fins 41, but not by the first fins 31 of the heat sink 20.

In another aspect, the width of the flanges 412, 413 of the second fins 41 exceeds that of the flanges 312, 313 of the first fins 31, such that a flow channel 43 formed between each two neighboring second fins 41 is wider than the flow channel 33 formed between each two neighboring first fins 31. In use, the second fin unit 40 having the wider flow channels 43 faces airflow (not shown) which has a relatively lower air pressure, and the first fin unit 30 having the narrower flow channels 33 faces airflow with relatively higher air pressure. Thus, the heat sink 20 retains effective function even in operation with fans generating uneven speed or pressure of airflow.

Figure 2:
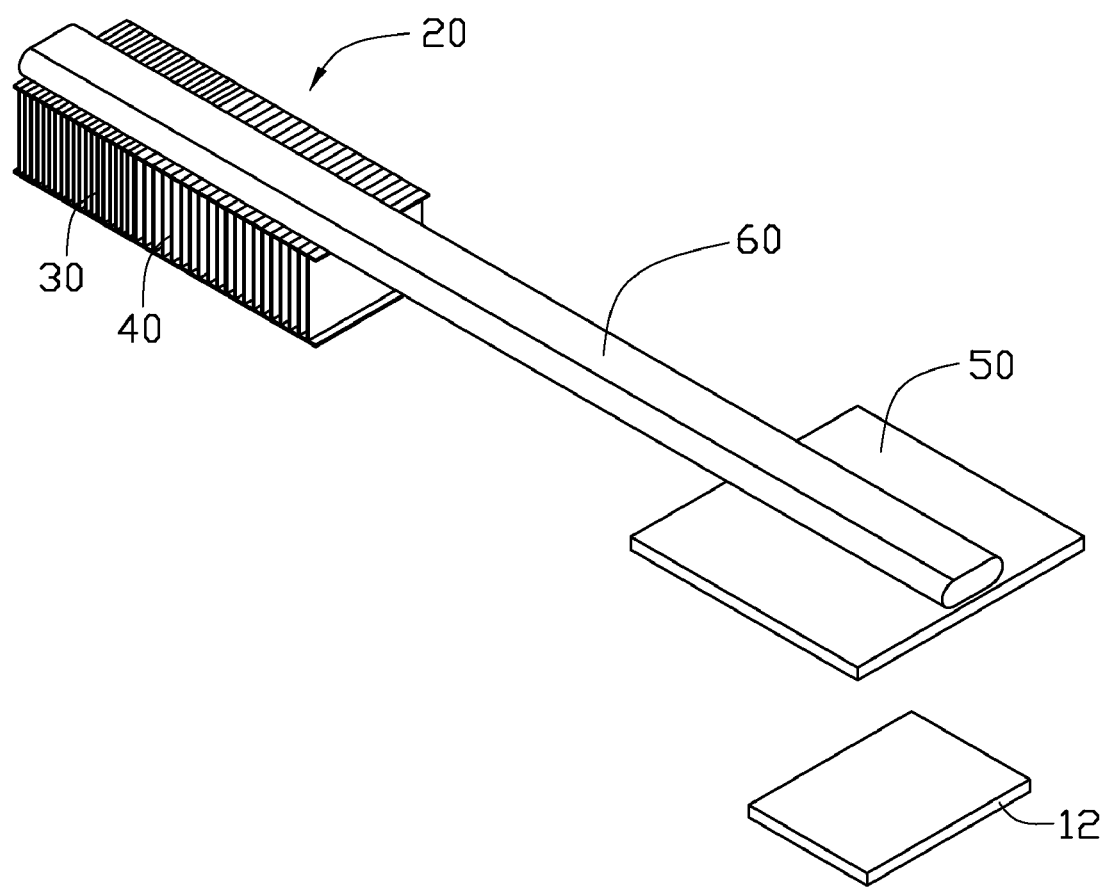
FIG. 2 is an isometric, assembled view of a heat dissipation device according to a second embodiment, together with an electronic component.
Figure 4:
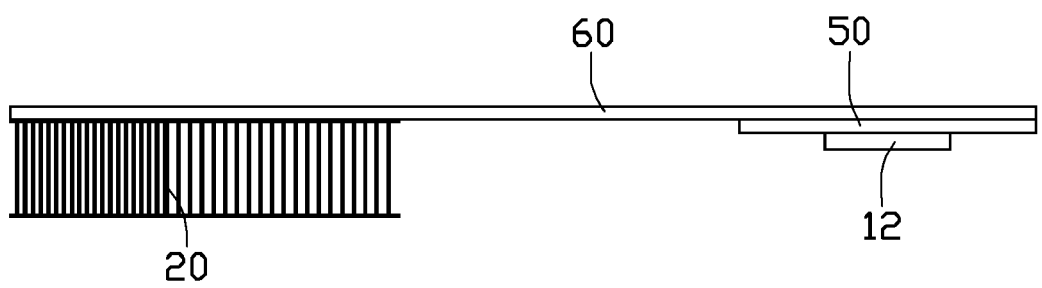
FIG. 4 is a front plan view of the heat dissipation device and electronic component of FIG. 2 attached together.

FIGS. 2 and 4 illustrate a heat dissipation device in accordance with a second embodiment, differing from the heat dissipation device of the first embodiment only in that the base 10 is replaced by a heat absorption block 50, and a heat pipe 60 thermally interconnects the heat sink 20 and the heat absorption block 50. The heat absorption block 50 is flat and includes a top surface and an opposite bottom surface, and the bottom surface is thermally attached to the electronic component 12. The heat pipe 60 is tubular with top and bottom surfaces thereof being planar. One end of the heat pipe 60 thermally connects with the top surface of the heat absorption block 50, and another end of the heat pipe 60 thermally connects with the top plate 22 of the heat sink 20.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink comprising:
a first fin unit comprising a plurality of parallel stacked first fins, each comprising a main body and two flanges extending perpendicularly from two opposite sides of the main body; and
a second fin unit comprising a plurality of parallel stacked second fins, each of the second fins comprising a main body and two flanges extending perpendicularly from two opposite sides of the main body of each second fin;
wherein the first fin unit and the second fin unit are arranged side by side with the second fin unit arranged at a rear side of the first fin unit, the main body of an outmost first fin is adjacent to the second fin unit and abuts the main body of an outmost second fin adjacent to the first fin unit, and the flanges of the first fins and the second fins extend in opposite directions of the heat sink respectively; and
wherein distal ends of the flanges of a rear first fin of each two neighboring first fins contact the main body of a front first fin of each two neighboring first fins, and the main body of a rear second fin of each two neighboring second fins contacts distal ends of the flanges of a front second fin of each two neighboring second fins.

2. The heat sink of claim 1, wherein the flanges of the second fins are wider than the flanges of the first fins.

3. A heat dissipation device comprising:
a flat plate thermally attached to an electronic component; and
a heat sink thermally connected with the flat plate, the heat sink comprising a first fin unit and a second fin unit located at a rear side of the first fin unit, the first fin unit comprising a plurality of parallel first fins each having a main body and two flanges extending from two opposite sides of the main body respectively, the second fin unit comprising a plurality of parallel second fins each having a main body and two flanges extending from two opposite sides of the main body of each second fin respectively, wherein the main body of an outmost first fin adjacent to the second fin unit abuts the main body of an outmost second fin adjacent to the first fin unit, and the flanges of the first fins and the flanges of the second fins extend in opposite directions of the heat sink respectively; and
wherein distal ends of the flanges of a rear first fin of each two neighboring first fins contact the main body of a front first fin of each two neighboring first fins, and the main body of a rear second fin of each two neighboring second fins contacts distal ends of the flanges of a front second fin of each two neighboring second fins.

4. The heat dissipation device of claim 3, wherein the flanges of the second fins are wider than the flanges of the first fins.

5. The heat dissipation device of claim 3, wherein the flanges of each of the first fins extend from top and bottom sides of the main body of each first fin respectively towards a front side of the main body of each first fin, and the flanges of each of the second fins extend from top and bottom sides of the main body of each second fin respectively towards a rear side of the main body of each second fin, and the bottom flanges of the first fins and the second fins are coplanar, forming a bottom plate of the heat sink, and the top flanges of the first fins and the second fins are coplanar, forming a top plate of the heat sink.

6. The heat dissipation device of claim 5, wherein the first and second fin units are fixed on the flat plate by soldering with the bottom plate contacting a top surface of the flat plate.

7. The heat dissipation device of claim 5, wherein the heat sink is thermally connected with the flat plate via a heat pipe located between the flat plate and the heat sink.

8. The heat dissipation device of claim 7, wherein the heat pipe is tubular and has one end thermally connected with the flat plate and another end thermally connected with the top plate of the heat sink.

9. A heat dissipation device comprising:
a flat plate thermally attached to an electronic component; and
a heat sink thermally connected with the flat plate, the heat sink comprising a first fin unit and a second fin unit, the first fin unit comprising a plurality of parallel first fins each having a main body and two flanges extending from two opposite sides of the main body respectively, the second fin unit comprising a plurality of parallel second fins each having a main body and two flanges extending from two opposite sides of the main body of each second fin respectively, wherein the main body of an outmost first fin adjacent to the second fin unit abuts the main body of an outmost second fin adjacent to the first fin unit, and the flanges of the first fins and the flanges of the second fins extend in opposite directions of the heat sink respectively;

wherein the flanges of each of the first fins extend from top and bottom sides of the main body of each first fin respectively towards a front side of the main body of each first fin, and the flanges of each of the second fins extend from top and bottom sides of the main body of each second fin respectively towards a rear side of the main body of each second fin, and the bottom flanges of the first fins and the second fins are coplanar, forming a bottom plate of the heat sink, and the top flanges of the first fins and the second fins are coplanar, forming a top plate of the heat sink.

10. The heat dissipation device of claim 9, wherein the first and second fin units are fixed on the flat plate by soldering with the bottom plate contacting a top surface of the flat plate.

11. The heat dissipation device of claim 9, wherein the heat sink is thermally connected with the flat plate via a heat pipe located between the flat plate and the heat sink.

12. The heat dissipation device of claim 11, wherein the heat pipe is tubular and has one end thermally connected with the flat plate and another end thermally connected with the top plate of the heat sink.

* * * * *